United States Patent
Park et al.

[11] Patent Number: 5,677,210
[45] Date of Patent: Oct. 14, 1997

[54] METHOD OF PRODUCING A FULLY PLANARIZED CONCAVE TRANSISTOR

[75] Inventors: Chan Kwang Park; Yo Hwan Koh; Seong Min Hwang; Kwang Myoung Roh, all of Bubaleub, Rep. of Korea

[73] Assignee: Hyundai Electronics Industries Co., Ltd., Rep. of Korea

[21] Appl. No.: 753,293

[22] Filed: Nov. 22, 1996

Related U.S. Application Data

[63] Continuation of Ser. No. 365,910, Dec. 29, 1994, abandoned.

[30] Foreign Application Priority Data

Dec. 29, 1993 [KR] Rep. of Korea ............ 1993-30866

[51] Int. Cl.[6] ................................ H01L 21/8232
[52] U.S. Cl. ............................ 437/40 R; 437/40 RG; 437/44; 437/203; 437/41 RLD
[58] Field of Search .................. 437/40, 203, 913, 437/44, 41, 29, 978, 979, 985, 40 RG, 41 RG, 41 RLD; 148/DIG. 116

[56] References Cited

U.S. PATENT DOCUMENTS

| | | | |
|---|---|---|---|
| 5,108,937 | 4/1992 | Tsai et al. | 437/40 |
| 5,164,325 | 11/1992 | Cogan et al. | 437/203 |
| 5,270,257 | 12/1993 | Shin | 437/44 |
| 5,382,534 | 1/1995 | Sheu et al. | 437/985 |

FOREIGN PATENT DOCUMENTS

| | | | |
|---|---|---|---|
| 63-94687 | 4/1988 | Japan | 437/40 |
| 63-287064 | 11/1988 | Japan | 437/40 |
| 5144839 | 6/1993 | Japan | 437/40 |

OTHER PUBLICATIONS

S. M. Sze; "VLSI Technology", pp. 131–142; 1983.

*Primary Examiner*—Michael Trinh
*Attorney, Agent, or Firm*—Merchant, Gould, Smith, Edell, Welter & Schmidt, P.A.

[57] ABSTRACT

A fully planarized concave transistor is produced having a structure, wherein a lightly doped drain(LDD) region and a source/drain region are formed and accumulated on a semiconductor substrate in a predetermined pattern, a thick insulating layer is formed on the surface and the sidewall of the source/drain, a gate formed between the source and drain, with a gate insulating layer is formed between the source and the gate, and between the drain and the gate to insulate therebetween.

5 Claims, 3 Drawing Sheets

METHOD OF PRODUCING A FULLY PLANARIZED CONCAVE TRANSISTOR

This is a Continuation of application Ser. No. 08/365,910, filed Dec. 29, 1994, now abandoned.

BACKGROUND OF THE INVENTION

1. Field of the Invention

The present invention relates to a fully planarized concave transistor, and in particular, relates to a fully planarized concave transistor capable of decreasing parasitic capacitances between a gate and a source, and between the gate and a drain, and more specifically relates to a method of producing such a fully planarized concave transistor.

2. Description of the Prior Art in manufacturing highly integrated semiconductor devices such as a VLSI device, it is necessary to reduce the topology of the device, such as, a transistor produced on the surface of a semiconductor substrate.

The conventional fully planarized concave transistor will be described hereinafter with reference to the attached drawing.

FIG. 1 is a cross-sectional view of the fully planarized concave transistor including a silicon substrate 1, a lightly doped drain (LDD) region 2, source/drain region 3, a gate oxide layer 5, and a polycrystalline silicon layer used as a gate electrode 6.

Referring to FIG. 1, the source/drain 3 and gate 6 are planarized on the silicon substrate 1, to increase substantially the depth of the junction without carrying out an additional planarization step to decrease a short channel effect of the transistor.

However, the above transistor device has considerable parasitic capacitances between the gate and the source, and between the gate and the drain, thereby decreasing the operational speed of the device.

SUMMARY OF THE INVENTION

With this problem in mind, therefore, it is an object of the present invention to provide a method of producing a fully planarized concave transistor, wherein parasitic capacitances between a gate and a source, and between the gate and a drain of the transistor are reduced.

In order to accomplish the above object, a fully planarized concave transistor according to the present invention comprises a semiconductor substrate, first and second lightly doped drain regions separately formed on the semiconductor substrate, a source and drain formed on the first and second lightly doped drain regions, an insulating layer formed in a sidewall and a surface of the source and the drain, a gate formed between the source and the drain, and a gate insulating layer formed between the source and the gate, and between the drain and the gate to insulate therebetween.

According to another aspect of the invention, there is provided a method of producing a fully planarized concave transistor, comprising the steps of: forming a lightly doped layer on a semiconductor substrate; forming a highly doped layer on the lightly doped layer; selectively etching the highly doped layer and the lightly doped layer to expose a part of the semiconductor substrate to form a source and a drain forming a thick insulating layer on a surface and a sidewall of the source and the drain; and forming a gate insulating layer on the whole structure and forming a gate electrode between the soirce and the drain.

BRIEF DESCRIPTION OF THE DRAWINGS

Additional objects and advantages will become apparent upon consideration of the following description when taken in conjunction with the accompanying drawings.

DETAILED DESCRIPTION OF THE PREFERRED EMBODIMENT

An embodiment of the present invention will now be described with reference to FIGS. 2 and 3A to 3D.

Figure 1:
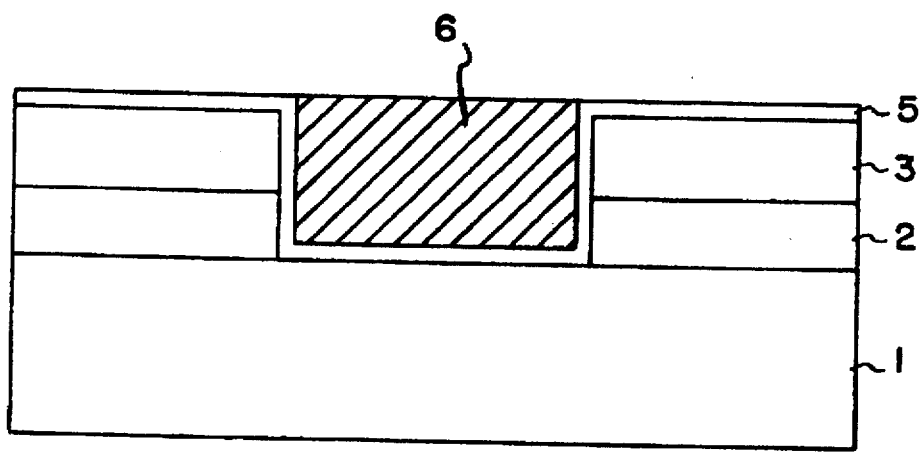
FIG. 1 is a cross-sectional view of a conventional fully planarized concave transistor.
Figure 2:
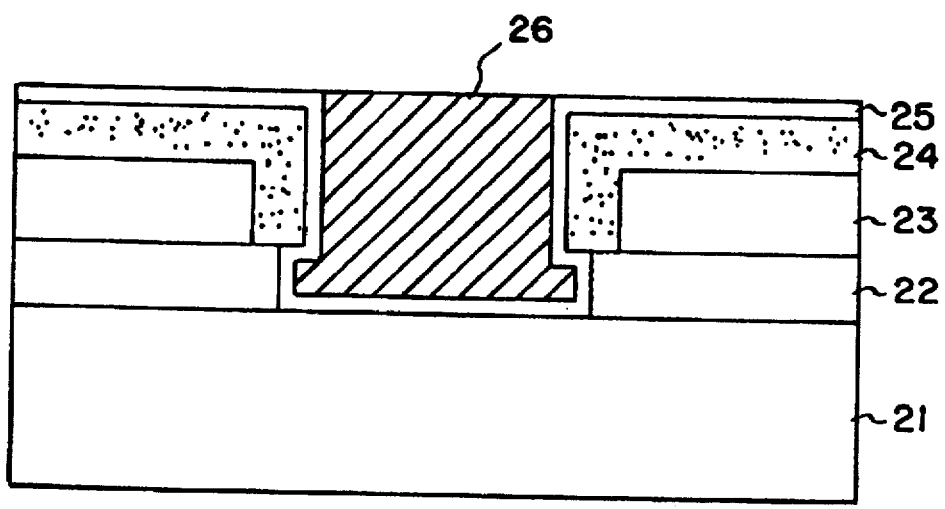
FIG. 2 is a cross-sectional view of a fully planarized concave transistor according to an embodiment of the present invention.

FIG. 2 is a cross-sectional view of a fully planarized concave transistor and FIGS. 3A to 3D are cross-sectional views showing an exemplary embodiment of process steps used in manufacturing a transistor having the structure of FIG. 2.

Referring to FIG. 2 the transistor has a structure, wherein a lightly doped drain(LDD) region 22 and a source/drain region 23 is formed and accumulated on a silicon substrate 21 in a predetermined pattern. A relatively thick insulating layer 24 is formed on the LDD region 22 and the source/drain 23. A gate 26 is formed between the source/drain region 23, with a gate insulating layer 25 formed between the source and the gate, and between the drain and the gate to provide insulation therebetween.

In the structure depicted in FIG. 2 the thick insulating layer 24 formed on predetermined portions of the LDD region 22 and the source/drain region 23 acts with the thin gate insulating layer 25 to increase the insulating capability. Thus, the parasitic capacitance between the gate and the drain can be decreased.

Next, the process of producing the transistor as mentioned above will be explained.

Figure 3A:
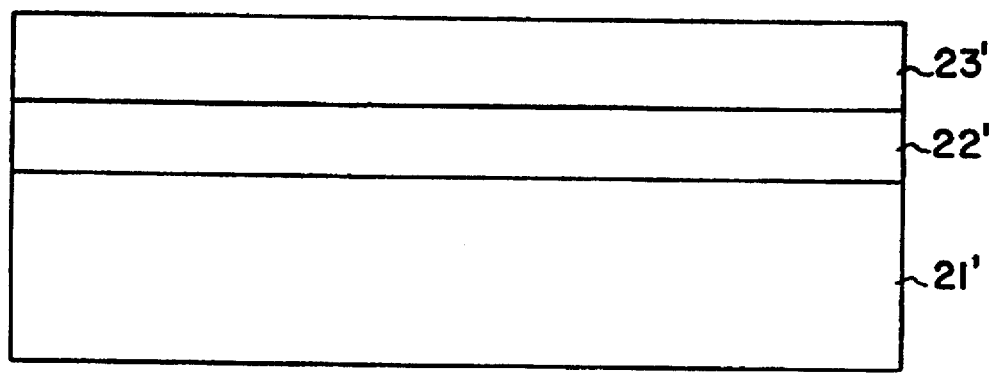
FIG. 3A to 3D are cross-sectional views for assistance explaining respective steps of the method of manufacturing the fully planarized concave transistor according to an embodiment of the present invention.

First, as shown in FIG. 3A, a layer 22', doped in a light impurity concentration (generally $10^{18}/cm^3$), is formed on a silicon substrate 21 to form the LDD region. A layer 23', doped in a high concentration (generally $10^{20}/cm^3$); is then formed on the lightly doped layer 22' to form the source/drain. The LDD region is provided to ensure the reliability of hot carriers.

Figure 3B:
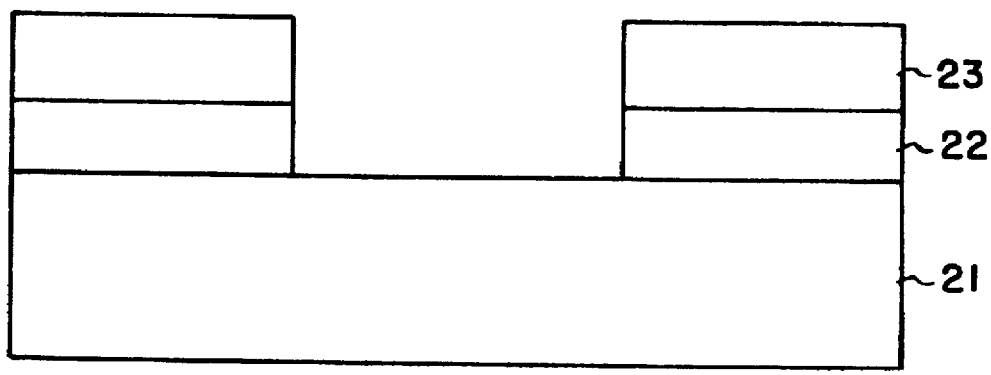

Next, as shown in FIG. 3B, the highly doped layer 23' and the lightly doped layer 22' are selectively etched to form patterns for the LDD region 22 and the source/drain 23 (FIG. 2), such that a portion of the silicon substrate 21, on which a gate electrode is to be formed, is exposed.

Figure 3C:
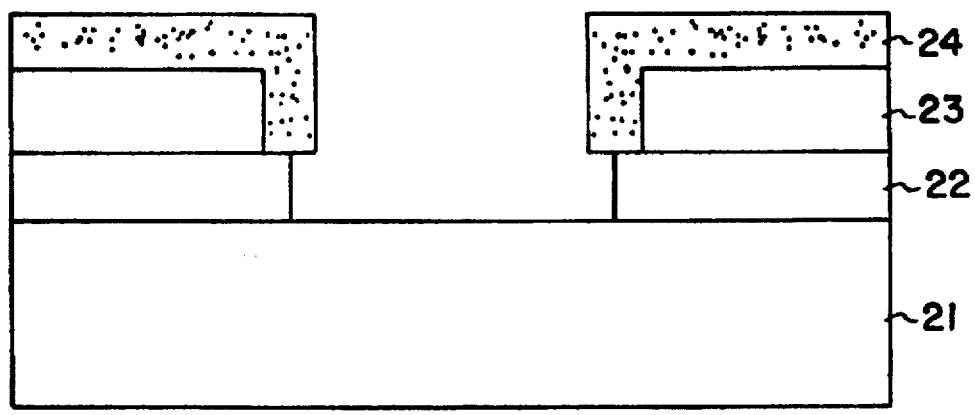

Thereafter, a low temperature oxidation process using a wet oxidation at a low temperature of 800 to 900 C. is performed on the structure shown in FIG. 3B. In this manner, an oxide layer for the highly doped source/drain 23 in grown two to ten times thicker than that of the LDD region 22 and the exposed silicon subsequently, the oxide layer formed on the side of LDD region 22 and the silicon substrate 21 is selectively etched to obtain a structure having a thick oxide layer 24 formed on the source/drain 23 as shown in FIG. 3C.

Figure 3D:
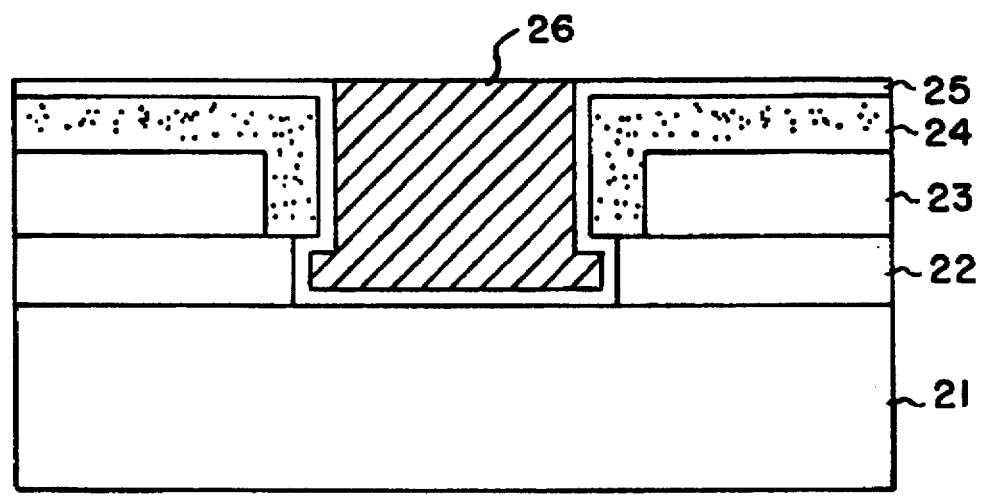

Finally, a thin gate oxide layer 25 is formed on the whole structure and a polycrystalline silicon layer 26, used as a gate electrode, is deposited. The whole surface of the polycrystalline silicon layer 26 is etched back, so that the surface of the gate oxide layer 25 is flush with the surface at the polycrystalline silicon layer 26. This results in a MOS transistor wherein the gate and the source/drain region are fully planarized as shown in FIG. 3D.

According to the present invention as mentioned above, since the thick oxide layer exists between the gate and the source, and between the gate and the drain, the parasitic capacitance therebetween can be decreased, thereby improving the operation speed of the device.

It is apparent to those skilled in the art that the present invention is not limited to the above mentioned embodiment and that various modifications may be made.

What is claimed is:

1. A method of producing a fully planar concave transistor, comprising the steps of:

forming a lightly doped layer having a first dopant concentration on a semiconductor substrate;

forming a highly doped layer having a second dopant concentration higher than the first dopant concentration on the lightly doped layer;

selectively etching the highly doped layer and the lightly doped layer to expose a part of the semiconductor substrate between opposite sidewalls of the lightly doped layer and the highly doped Layer and to form patterns for a source and a drain;

forming a thick insulating layer on a surface and the opposite sidewalls of the highly doped layer so that the highly doped layer forms the source and the drain from the patterns thereof;

then, forming a gate insulating layer on the thick insulating layer, the opposite sidewalls of the lightly doped layer, and the exposed part of the semiconductor substrate;

then, forming a gate electrode between the opposite sidewalls of the lightly doped layer and the highly doped layer between the source and the drain and;

etching the gate electrode to make the gate electrode planar with the gate insulating layer on the thick insulating layer.

2. A method according to claim 1, wherein the step of forming said thick insulating layer comprises a low temperature oxidation step.

3. A method according to claim 2, wherein said low temperature oxidation step is performed in a temperature of 750 to 950 C.

4. A method according to claim 1, wherein the step of forming a thick insulating layer on the surface and the sidewall of the highly doped layer comprises the steps of:

forming an insulating layer on the opposite sidewalls of the highly doped layer and the lightly doped layer such that the insulating layer on the sidewalls of the highly doped layer is thicker than the insulating layer formed on the sidewalls of the lightly doped layer; and blanket etching the insulating layer to remove the insulating layer formed on the sidewalls of the lightly doped layer to expose first and second lightly doped layers while leaving a thick insulating layer formed on the sidewalls of the highly doped layer so that the highly doped layer forms the source and the drain.

5. A method according to claim 1, wherein forming a thick insulating layer on a surface and a sidewall of the highly doped layer includes forming a thickness of the insulating layer formed on a side of the highly doped layer to be two to ten times thicker than a thickness of the insulating layer formed on a side of the lightly doped layer.

* * * * *